United States Patent
Li et al.

(10) Patent No.: US 8,193,072 B2
(45) Date of Patent: Jun. 5, 2012

(54) SEMICONDUCTOR WAFER COAT LAYERS AND METHODS THEREFOR

(75) Inventors: Eric J. Li, Chandler, AZ (US); Daoqiang Lu, Chandler, AZ (US); Christopher L. Rumer, Chandler, AZ (US); Paul A. Koning, Chandler, AZ (US); Darcy E. Fleming, Tempe, AZ (US); Gudbjorg H. Oskarsdottir, Chandler, AZ (US); Tiffany Byrne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/938,281

(22) Filed: Nov. 2, 2010

(65) Prior Publication Data

US 2011/0059596 A1    Mar. 10, 2011

Related U.S. Application Data

(60) Division of application No. 11/801,465, filed on May 9, 2007, now Pat. No. 7,897,486, which is a continuation of application No. 11/097,424, filed on Mar. 31, 2005, now Pat. No. 7,279,362.

(51) Int. Cl.
*H01L 21/78* (2006.01)

(52) U.S. Cl. ........ 438/462; 438/461; 438/460; 438/463; 257/E21.559

(58) Field of Classification Search .................. 438/460, 438/461, 462, 463; 257/E21.559
See application file for complete search history.

(56) References Cited

U.S. PATENT DOCUMENTS

| | | | |
|---|---|---|---|
| 4,734,481 A | 3/1988 | Steinmann | |
| 5,393,697 A * | 2/1995 | Chang et al. | .................. 438/613 |
| 6,974,726 B2 | 12/2005 | Dani et al. | |
| 2004/0155334 A1 * | 8/2004 | Honda | .......................... 257/734 |
| 2004/0195696 A1 | 10/2004 | Lee et al. | |
| 2005/0028361 A1 | 2/2005 | Yin et al. | |

\* cited by examiner

*Primary Examiner* — Thinh T Nguyen
(74) *Attorney, Agent, or Firm* — Blakely, Sokoloff, Taylor & Zafman LLP

(57) ABSTRACT

Formulations and processes for forming wafer coat layers are disclosed. In one embodiment, an organic surface protectant is incorporated into a wafer coat formulation deposited onto a semiconductor wafer prior to the laser scribe operation. Upon removal of the wafer coat layer, the organic surface protectant remains on the bumps and thereby prevents oxidation of the bumps between die prep and chip and attach. In an alternative embodiment, an ultraviolet light absorber is added to the wafer coat formulation to enhance the wafer coat layer's energy absorption and thereby improve the laser's ability to ablate the wafer coat layer. In an alternative embodiment, a conformal wafer coat layer is deposited on the wafer and die bumps, thereby reducing wafer coat layer thickness variations that can impact the laser scribing ability.

9 Claims, 5 Drawing Sheets

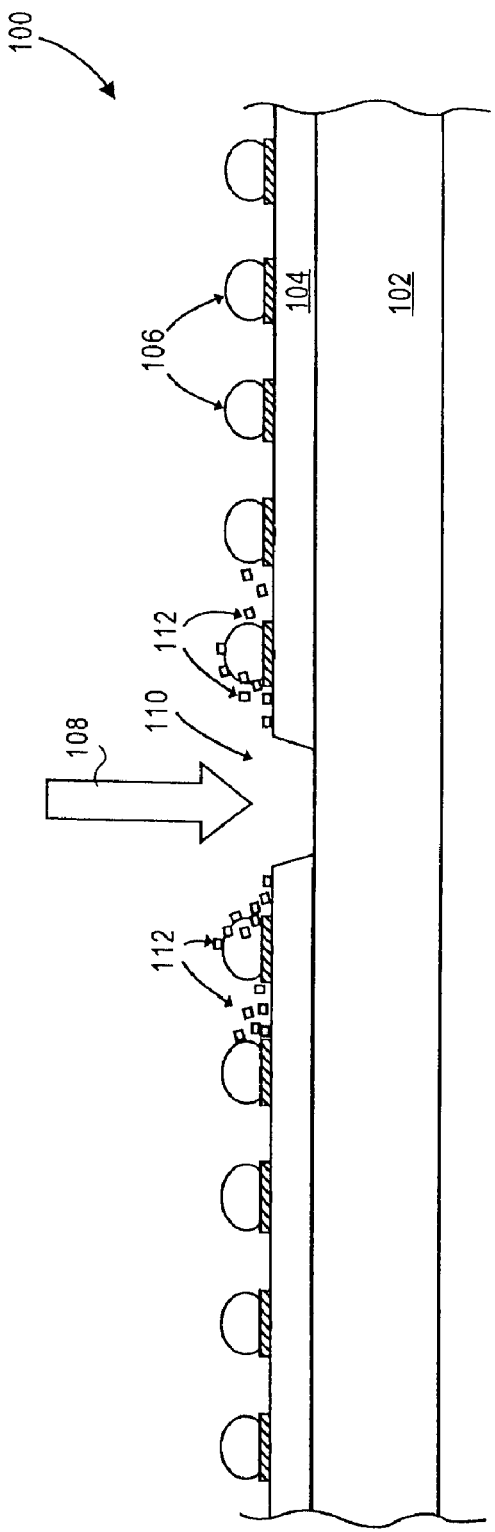
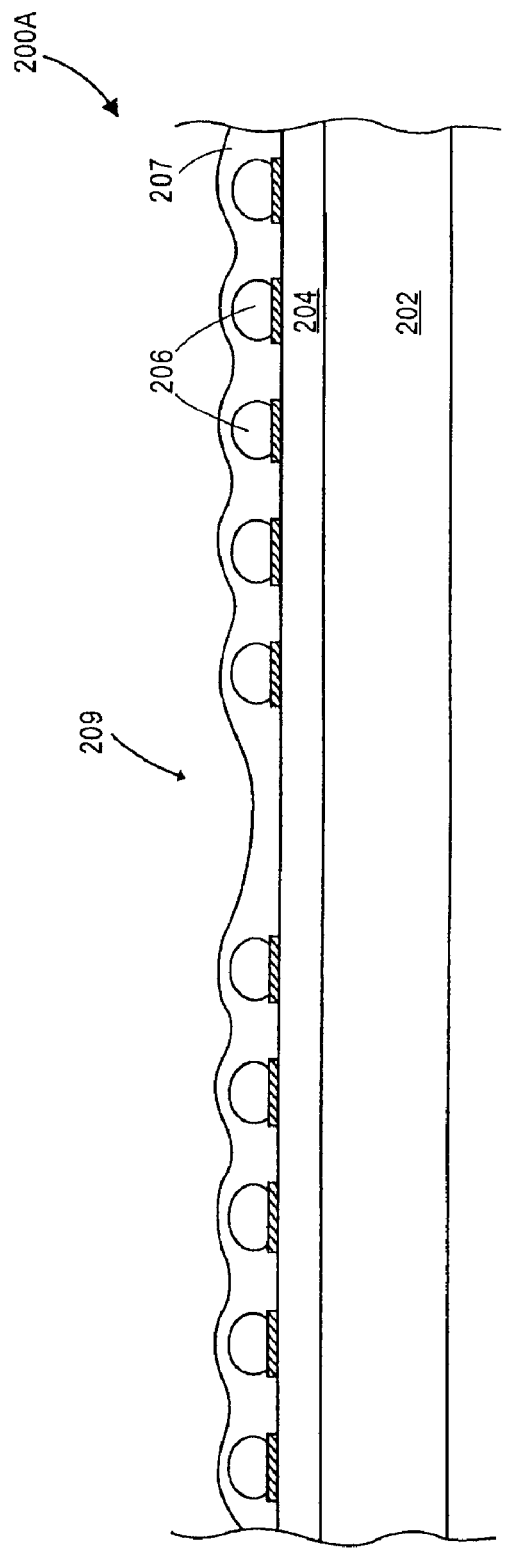
FIG. 1 (PRIOR ART)
FIG. 2A (PRIOR ART)

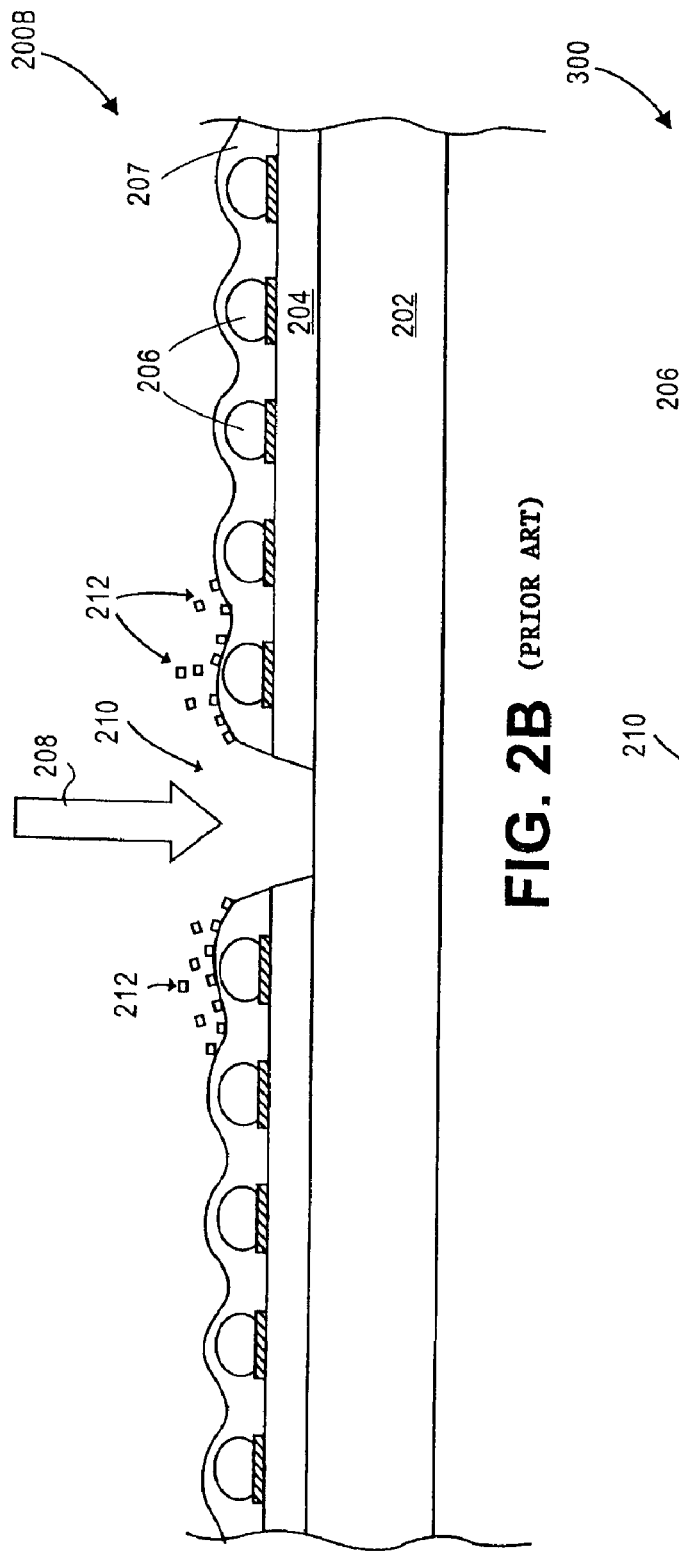
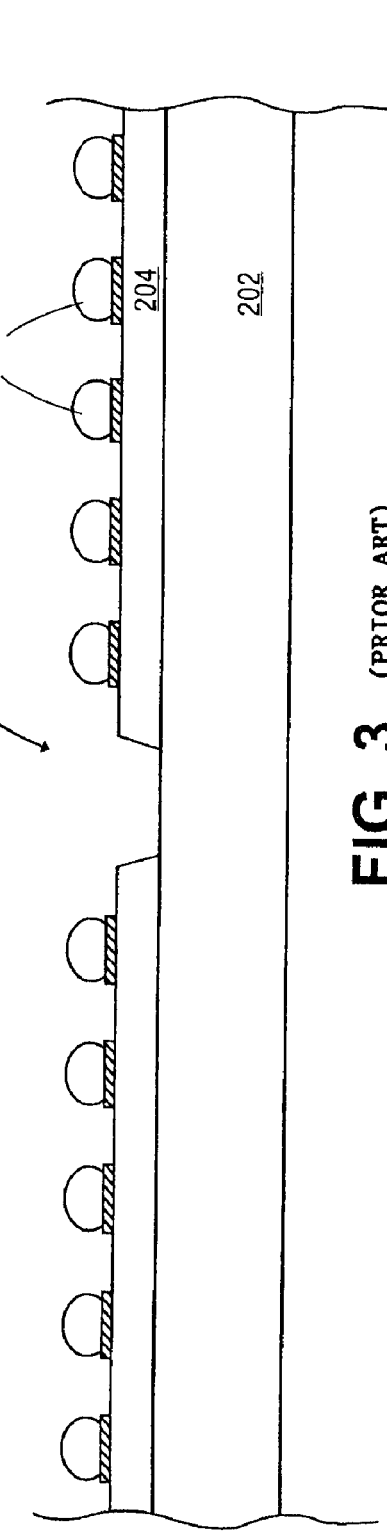

US 8,193,072 B2

SEMICONDUCTOR WAFER COAT LAYERS AND METHODS THEREFOR

This is a Divisional application of Ser. No. 11/801,465, filed May 9, 2007 now U.S. Pat. No. 7,897,486 which is Continuation application of Ser. No. 11/097,424 filed Mar. 31, 2005 now U.S. Pat. No. 7,279,362.

FIELD OF THE INVENTION

Embodiments of the present invention relate generally to semiconductor processing and more specifically to forming wafer coat layers on semiconductor substrates.

BACKGROUND OF THE INVENTION

With a need to incorporate low dielectric constant (low-k) interlayer dielectrics (ILDs) into semiconductor technology, has come the realization that low-k ILDs may not seamlessly integrate into existing semiconductor process flows. One place where this is evident is at the back-end saw singulation process. This is because low-k materials are mechanically weaker than conventional silicon dioxide. Consequently, sawing can damage the low-k ILD and adjacent circuitry and impact the yield and reliability of the semiconductor device. To overcome this, some manufacturers use lasers to first scribe through the various layers formed over the semiconductor wafer (including the low-k ILD) and then use the saw to cut through the bulk of the semiconductor wafer, thereby singulating the wafer with a two-step process.

The use of lasers, however, is not without its own set of manufacturing issues. For example, as the laser scribes the wafer it can produce a cloud of debris, and particles from the debris can deposit on exposed wafer surfaces. An illustration of this is shown in the cross-sectional view of the semiconductor wafer 100 in FIG. 1. Unless removed, the debris can impact the yield and reliability of singulated semiconductor devices during/after subsequent packaging.

As shown in FIG. 1, a laser beam 108 ablates and thereby removes from the scribe line region 110 the various device layers 104 formed over semiconductor substrate 102. As a result, debris 112 generated by the laser can deposit onto bumps 106. The debris 112 is problematic because to the extent it is not removed, it can produce non-wetting of the solder bumps during the chip-attach operation. This can result in electrical opens between semiconductor devices and their corresponding packaging substrates.

Shown in FIG. 2A is a cross-sectional view of a semiconductor wafer 200A that has been prepared for laser scribe. Here, the debris 112 problem (shown in FIG. 1) has been addressed by depositing a wafer coat layer 207 over the bumps 206 before scribing the wafer 200A (for the purpose of this specification, a wafer coat layer is a layer formed over bumps on a wafer, so as to protect them during the laser scribe operation). So, as shown in FIG. 2B, instead of depositing onto the bumps 206, the laser-generated debris 212 deposits on the wafer coat layer 207 where it can be rinsed-off later during the wafer coat layer removal process. As shown in FIG. 3, after the wafer coat layer and debris 212 (shown in FIG. 2B) have been removed, a scribe line 210 has been formed through the various device layers 204 of the semiconductor substrate 300 along the wafer's street regions. The scribe line exposes the underlying bulk semiconductor substrate 202 and the bumps 206 have minimal residual debris on them.

However, the wafer coat layer 207 too present a number of integration challenges. For example, the added wafer coat layer increases manufacturing cycle time and can cause materials interactions, which in turn can result in increased oxidation of the die bumps and affect die attach interconnectivity. Also, to the extent that the wafer coat layer is transparent to the laser, it must be removed via some other mechanism besides ablation. And, to the extent that the wafer coat layer 207 optically refracts, diffracts, and/or scatter the laser's beam, it can interfere with the laser's ability to ablate the various underlying device layers.

BRIEF DESCRIPTION OF THE DRAWINGS

FIG. 1 illustrates a cross-sectional view of a portion of a semiconductor wafer being scribed using a laser.

FIG. 2A illustrates a cross-sectional view of a portion of a semiconductor wafer having a wafer coat layer.

FIG. 2B illustrates a cross-sectional view of semiconductor wafer of FIG. 2A while being scribed using a laser.

FIG. 3 illustrates a cross-sectional view of the semiconductor wafer of FIG. 2B after scribing the semiconductor wafer and removing the wafer coat layer.

Figure 4:
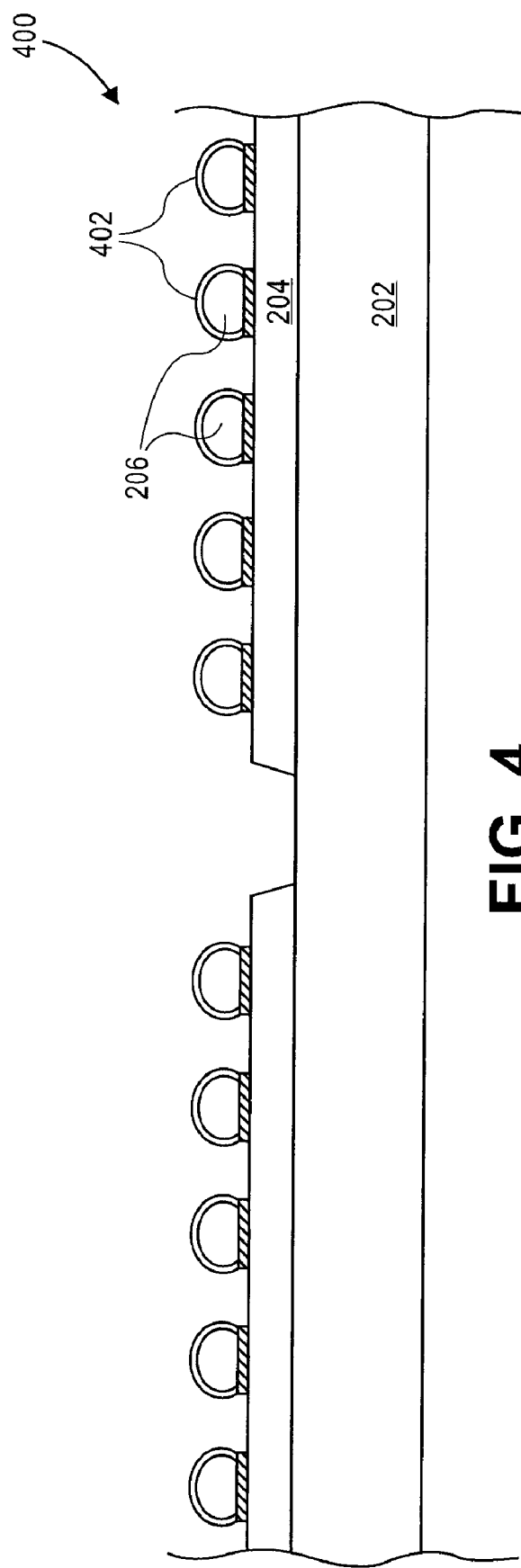
FIG. 4 illustrates a cross-sectional view of a portion of a semiconductor wafer having a bump oxidation prevention layer formed in accordance with an embodiment of the present invention.

It will be appreciated that for simplicity and clarity of illustration, elements in the drawings have not necessarily been drawn to scale. For example, the dimensions of some of the elements may be exaggerated relative to other elements for clarity. Further, where considered appropriate, reference numerals have been repeated among the drawings to indicate corresponding or analogous elements.

DETAILED DESCRIPTION

In the following detailed description, methods for improving processes related to semiconductor substrate laser scribing are disclosed. Reference is made to the accompanying drawings within which are shown, by way of illustration, specific embodiments by which the present invention may be practiced. In other instances, well known features may be omitted or simplified in order not to obscure embodiments of the present invention. It is to be understood that other embodiments may exist and that other structural changes may be made without departing from the scope and spirit of the present invention.

The terms on, above, below, and adjacent as used herein to refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, an organic surface protectant (OSP) is incorporated into the wafer coat layer's formulation. After laser scribe and subsequent removal of the wafer coat layer, the OSP component continues to protect die bumps by preventing oxidation during the time between die prep and chip-attach. In a second embodiment, an ultraviolet absorber is added to the wafer coat formulation to make it less transparent to the laser's energy. In this way, the laser can directly ablate the wafer coat layer and not rely on the superheating of underlying films to thermally degrade and remove wafer coat layer material from the scribe line regions. In a third embodiment, a conformal wafer coat layer is deposited using vacuum deposition process. Increased conformality translates to a reduction in overall wafer coat thickness variation, which can reduce the refraction, diffraction, and scattering effects that the wafer coat layer can have on the laser scribing process. These embodiments and variations thereof will be further discussed and may be better understood with respect to FIGS. 4-8 discussed below.

In accordance with one embodiment (discussed with respect to FIGS. 2A, 2B, and 4), the wafer coat layer is used as a vehicle to apply an OSP layer to the wafer bumps (i.e., the OSP is included in the wafer coat formulation as an OSP additive). Then when the wafer coat layer is removed, the OSP remains as a layer on the bumps. Incorporating the OSP additive into the wafer coat formulation extends the functionality of the wafer coat step, reduces cycle time by eliminating the need to separately apply the OSP layer, and eliminates the need to use additional processing equipment and floor space. The OSP layer can reduce the amount of die bump oxidation formed between the wafer-coat and chip-attach operations and thereby reduces the level of defects related to die-attach fluxing, as explained below.

Bump oxidation is inherent during the normal assembly process. Typically, this oxide is cleaned from the bump surfaces prior to the chip-attach operation by incorporating a fluxing step. The chip-attach fluxing step enhances the solder bump's wetting ability and thereby bonds (and electrically attaches) the die and package substrate together during the chip-attach operation. Wetting ability, as known to one of ordinary skill, refers to the ability of the bump, while in a molten metal state, to wet the substrate surface under a given set of conditions. This is an important performance parameter because it directly affects the integrity of bump's interconnection with the packaging substrate. To the extent that heavy oxidation of the bumps exists, outgassing caused by reduction of metal oxides (i.e., the bump oxidation) during the chip-attach fluxing step can produce voids in the bumps and/or underfill material that can affect die yields and/or reliability.

Bumps can be protected against oxidation by forming an organic surface protectant (OSP) over them. In accordance with this embodiment, the OSP layer disclosed herein is incorporated into an existing processing step (i.e., the wafer coat step). Decreasing the amount of oxide formed on the bumps also decreases the amount of flux necessary to remove bump oxidation. This can reduce outgassing and the formation of voids in the bumps and underfill. Bump voids can impact the bumps ability to conduct current, and underfill voids can impact the die's ability to adhere to the packaging substrate. Both of which can impact the packaged devices yield and reliability.

Referring to FIGS. 2A, 2B, and 4, a process incorporating an OSP-containing wafer coat layer will be described. It should be apparent to one of ordinary skill that one advantage of this embodiment is its ability to easily be incorporated into existing process flows. As such, the wafer coat layer can be formed over semiconductor device layers and bumps, similar to that shown in FIG. 2A. Unlike the prior art however, the wafer coat layer has an OSP additive incorporated into the wafer coat layer formulation. In accordance with one embodiment, the wafer coat layer can be a conventional water soluble BGA attach flux, such as the Sparkle Flux FTW-385 manufactured by Senju Metal Industry Co., Ltd. and the OSP can include any number OSP chemistries, such as for example benzotriazol, benzimidazol, imidazol, and the like. The OSP additive can be added to the flux at or prior to its point of use or it can be added by the supplier of the wafer coat material.

The combination OSP/wafer coat formulation can then be applied on the wafer using a conventional wafer coat process, such as for example using a blanket spray-on process, a spin-on process, dipping, screen printing, or the like. After the OSP-containing wafer coat layer has been deposited, the wafer can be laser scribed to ablate/remove the various device layers from over the substrate, similar to that shown in FIG. 2B. Debris that is generated deposits onto to the wafer coat layer. Then, as shown in the cross-sectional view of the wafer 400 of FIG. 4, the wafer coat layer is removed. Removal can be accomplished using a conventional wafer coat clean. In embodiments, where the wafer coat layer is water soluble BGA attach flux, the wafer coat layer can be removed using water, a water-based solution, or the like. As shown in FIG. 4, unlike the prior art which completely removes the wafer coat, the OSP layer component 402 remains over the bumps 206 where it can limit the amount of subsequent bump oxidation prior to chip-attach. The wafer can thereafter be singulated into individual die using a conventional mechanical sawing process. Removal of the wafer coat layer can be removed before, during, or after the wafer sawing process.

The OSP-containing singulated die can then be processed through any number of processing steps intermediate to the chip-attach operation with reduced concerns of encountering oxidation-related problems. For example, to the extent that the OSP-containing singulated die is to be processed through a chip-attach module that includes a capillary underfill (CUF) process flow, the die can thereafter be attached to a packaging substrate using a conventional chip-attach flux and reflow operation. In accordance with one embodiment, during the reflow to attach the die and package substrate, the flux is activated and the OSP and oxide that have formed on the bumps are thereby removed. After reflow, chip-attach flux residues can be removed using a conventional de-flux process (e.g., hot water). The attached die/package substrate can then continue on to the underfill process module, where underfill material is introduced between the die and the packaging substrate via a conventional capillary underfill process. In accordance with embodiments that use this type of process flow, the OSP layer, by reducing the amount of oxide formed on the bumps, can decrease the amount of chip-attach flux necessary to remove bump oxidation and/or the amount of outgassing that can occur during die attach reflow. This can reduce the occurrence of voids in the bumps and thereby improve their mechanical integrity and ability to pass current.

To the extent that the OSP-containing singulated die is to be process through a chip-attach module that includes a no-flow (NUF) underfill process, the OSP-containing singulated die can then be attached to a packaging substrate by heating the packaging substrate, dispensing the NUF material on it, positioning the die on/in the NUF and then using a thermal-compression bonding process to reflow and attach the die to the packaging substrate. Unlike the capillary underfill process, underfill in the NUF process is dispensed onto the substrate prior to the die being bonded to the packaging substrate. In the NUF process, the flux is embedded in the NUF formulation. So, during reflow, the chip-attach flux activates and removes the oxide and OSP thereby allowing the die bumps and substrate solder bumps to reflow and form interconnected joints. After reflow, further cure of underfill can be performed in a post cure oven. In accordance with embodiments that use this type of process flow, the OSP layer, by reducing the amount of oxide formed on the bumps, decreases the amount of outgassing that can occur during die attach reflow. This can reduce the occurrence of voids both in the bumps and in the underfill. To the extent that voids in the bumps are reduced, their mechanical integrity and ability to pass current correspondingly increases. To the extent that voids in the underfill are reduced, the mechanical integrity of the bond between the die and packaging substrate correspondingly increases.

Figure 5:
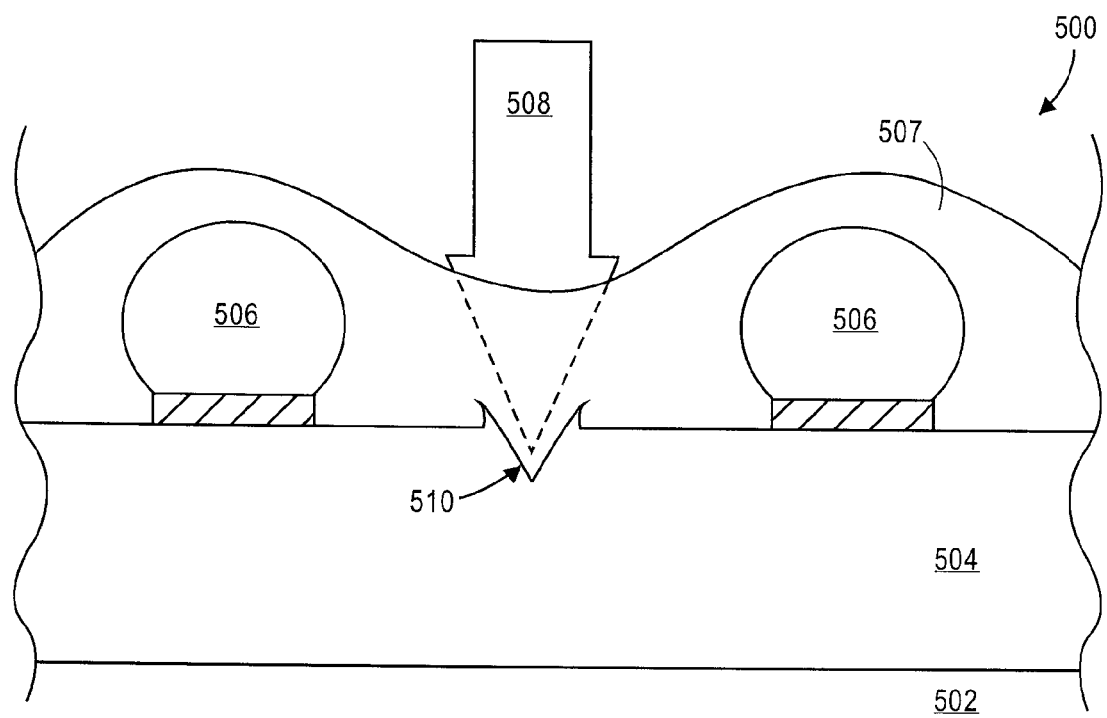
FIG. 5 illustrates a cross-sectional view showing laser scribing of a portion of a semiconductor wafer having a conventional wafer coat layer.
Figure 6:
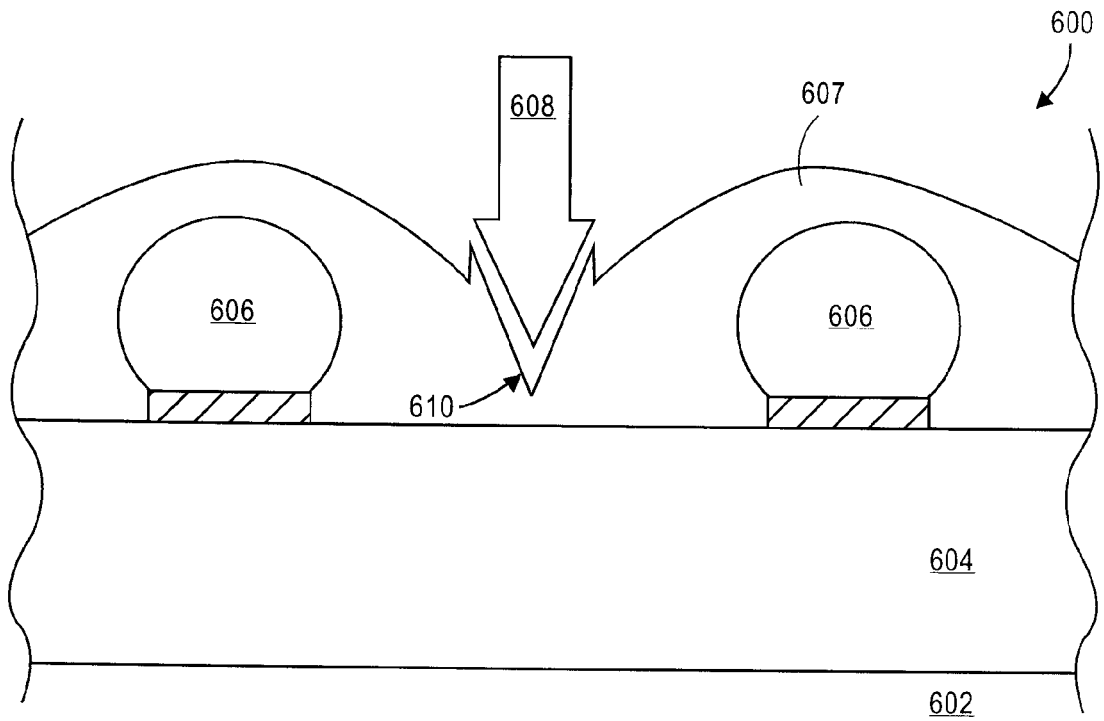
FIG. 6 illustrates a cross-sectional view showing laser scribing of a portion of a semiconductor wafer having a wafer coat layer formed in accordance with an embodiment of the present invention.

In accordance with an alternative embodiment discussed with respect to FIGS. 5 and 6, a scribing laser's ability to ablate underlying device layers is improved by adding an ultraviolet (UV) absorber to the wafer coat formulation. The UV absorber can enhance the wafer coat layer's ability to absorb laser energy thereby facilitating its ablation. In this way, the wafer coat layer, which is substantially transparent to the laser's UV energy, can be removed or degraded (i.e. the physical integrity of the wafer coat layer can be degraded) before ablating the underlying device layers. To the extent that the wafer coat layer is removed via ablation, the laser can then more efficiently ablate the underlying device layers. To the extent that the wafer coat layer can be degraded, explosive removal of the wafer coat layer incident to underlying device layer ablation is accomplished more easily. In other words, in accordance with this embodiment, a process is disclosed whereby the wafer coat layer burns away/degrades from the top down during the laser scribe operation rather than being mechanically displaced (e.g., explodes away) from the bottom up.

Shown in FIG. 5 is a representative cross-sectional view of the laser scribing of a wafer 500 having a conventional wafer coat layer 507. FIG. 5 includes a semiconductor substrate 502 over which semiconductor device layers 504, conductive bumps 506, and the conventional wafer coat layer 507 are formed. As indicated in FIG. 5 by the dashed line portions of the laser beam 508, the wafer coat layer 507 is substantially transparent to the laser's ultraviolet beam energy. Consequently, the laser beam 508 passes through the wafer coat layer 507 and then upon reaching the underlying device layer 504, ablates it. Consequently, the wafer coat layer 507 is not removed by the laser beam 508. Instead, the wafer coat layer's removal occurs as a result of superheating those portions 510 of the device layers 504 and then using superheated gasses to thermally degrade and eventually explode away (not shown) portions of the wafer coat layer overlying the scribe line street regions.

To the extent that anything interferes with the laser's ability to explode away portions of the wafer coat layer over the scribe line, residual device layer scribe line material can be left intact, in which case defects in the form of unablated scribe line material can result. These defects can cause damage to device layers in adjacent semiconductor die during the wafer sawing process. Defect sources may, among other things, be the result of thickness or composition variations in the wafer coat layer. In which case those portions of the wafer coat layer that are thicker or more resistant to physical (i.e. explosive) removal have the potential to not be removed and thereby result in the formation of defects.

Thickness variations can be attributed to, among other things, poor uniformity of the wafer coat layer spray coating; the relative proximity and spatial variation of wafer bumps or test structures near the scribe street; and/or small scale de-wetting and localized collection/pooling of the wafer coat layer as it adheres to structures having different compositions (e.g., surface tensions effects associated with the wafer bumps, passivation layer and/or recesses in the scribe street area). Composition variations in the wafer coat layer can be the result of, among other things, localized changes in the integrity of the wafer coat layer as a result interactions between the wafer coat layer with underlying passivation layer materials, bump metallization, etc.

Regardless of which cause is most responsible for generating these defects, modifying the wafer coat layer so it ablates from the top-down rather than from the bottom-up has the potential to reduce/eliminate defects caused by these problems. An example of the mechanics of top-down ablation using a wafer coat layer 608 modified in accordance with an embodiment of the present invention is illustrated in FIG. 6. Shown in FIG. 6 is a cross-section of a portion of a wafer 600. The wafer 600 includes a semiconductor substrate 602 over which semiconductor device layers 604, conductive bumps 606, and a modified wafer coat layer 607 are formed. As shown in FIG. 6, unlike the conventional wafer coat layer of FIG. 5, the wafer coat layer 607 is formulated in accordance with an embodiment of the present invention, so it can absorb UV energy from laser beam 608. As a result, portions 610 of the wafer coat layer 607 are removed via ablation. So here, as a result of including UV absorbing additive(s) into the wafer coat layer formulation, the mechanics of the wafer coat layer's removal during scribing changes from a physical explosive process to direct (or indirect) ablation. In this way, those portions of the wafer coat layer overlying the wafer street region are ablated prior to or concomitantly along with the underlying device layers. To the extent that the wafer coat layer is ablated prior to ablating the underlying device layer, occurrences of residual ablated material being trapped under unexploded wafer coat layer portions can be significantly reduced. Alternatively, the UV absorber can be included in the wafer coat layer 607 in an amount that increases absorption of the laser's UV radiation without causing substantial ablation of it. This can weaken the integrity of the wafer coat layer so when ablation of the underlying device layers does occur, removal of the wafer coat layer incident to the underlying ablation occurs much more easily than it otherwise could.

The wafer coat formulation can be made UV absorbing by including organic additives capable of absorbing radiation at the laser's operating frequency. In embodiments where the laser's frequency is in the UV-A portion of the electromagnetic spectrum, these additives can include molecules generally described as benzophenones, diphenyl acrylates, cinnamates and sterically hindered amines. Selection of the appropriate additive should take into account compatibility with the base wafer coat layer material (i.e., the UV absorber should be compatible with the wafer coat material). The degree of solubility of the additive can depend upon the molecular group(s) attached to it. As such, the additive can be made more or less soluble relative to the base wafer coat layer by changing the type and nature of these groups. So, for example, where the base wafer coat layer material is an isopropyl alcohol-based material (for example conventional solder-fluxing agent, such as a WF-series Sparkle flux from Senju Metal Industry Co., discussed below), an alcohol soluble UV absorber, such as a benzophenone structure having four hydroxy (—OH) groups attached to it, can be used. If however, two of the hydroxy groups on the benzophenone are changed to methoxy groups (—OCH3), then alcohol solubility will be lost. From another perspective, if the particular base wafer coat material selected is soluble in a specific solvent, then a UV absorbing additive should be selected that is soluble in that same solvent. So for example, if the wafer coat formulation is soluble in toluene, then a toluene-soluble UV absorbing additive should be used in the base wafer coat formulation.

As disclosed herein, the base wafer coat layer material is a solder fluxing agent. One of ordinary skill appreciates however that any number of other materials suitable for protecting bumps during the laser scribe operation can be used as the base wafer coat layer. After the additive is included in the base wafer coat layer, the UV absorber-containing wafer coat layer can be applied via spray coating, dip coating, spin coating, screen printing, or the like.

In one specific implementation of this embodiment, UV additive Uvinul® 3050 from BASF Aktiengesellschaft (2,2', 4,4'-Tetrahydroxybenzophenone) was added to a WF-series (WF-7700) Sparkle flux (base wafer coat material) from Senju Metal Industry Co., Ltd. Uvinul® 3050 was included in the wafer formulation in amounts that ranged from approximately 0.25 to 1.0 wt % based on dry solids (e.g., amounts of Uvinul® 3050 ranging between 0.25 grams and 1.0 grams were added to 100 grams of Sparkle flux). The UV absorber-containing wafer coat formulation was then spray coated onto a wafers at different thicknesses ranging from 15 and 25 microns. Finally the wafers were laser scribed and then washed off with water. In those wafers that included the UV modified wafer coating, residual scribe line defects were eliminated. This is in contrast to control wafers that were coated using a conventional wafer coat process and then laser scribed. In these wafers, mild to severe defects remained in the street (scribe) regions.

Of course, one of ordinary skill understands that the amount of UV absorbing additives added to the wafer coat base layer is dependent upon, among other things, the efficiency of the UV absorber (i.e., its ability to absorb UV radiation) and the amount of UV absorption required. So in cases where a UV absorbing additive is more or less efficient than that of the Uvinul® 3050 described herein, then more or less additive may be used in the base wafer coat layer to achieve an amount of UV absorption desired. Similarly, to the extent that more or less additive (e.g., Uvinul® 3050) is added to the base wafer coat layer described herein, then more or less UV absorption may occur as a result of the formulation modification, as so desired.

The embodiments discussed with respect to FIGS. 5 and 6 facilitate the use of UV lasers for performing laser scribing operations. This can be advantageous when scribing narrow street regions because the UV lasers have relatively small ablation spot sizes. Also, the UV absorber can be added to the wafer coat formulation in specific amounts that permit tuning the degree of UV absorption/ablation called for by the process. The ability to vary the amount of UV absorber in the wafer coat formulation also provides an ability to adjust the wafer coat layer's UV absorption independent from its thickness. This can be a consideration with respect to throughput at the laser scribing operation (i.e. the amount of UV absorber in thick wafer coat layers can be reduced/increased to improve laser scribing cycle time). In addition, by using a UV absorber, the wafer coat layer can remain transparent to visible light. This allows the laser scribe alignment vision system to identify and use fiducial marks to align the wafers. The UV absorber-containing wafer coat layer can also be incorporated into existing manufacturing lines without the need to make significant equipment and/or process flow changes. Moreover, while the forgoing discussion focused on the use of UV absorbers in conjunction with wafer coat formulations to enhance ablation of the wafer coat layer by lasers that operate in the UV portion of the electromagnetic spectrum, one of ordinary skill recognizes that variations of these embodiments can similarly be used to enhance the absorption of other types of lasers (e.g., infrared (IR) lasers) that are used to scribe wafers.

Figure 7:
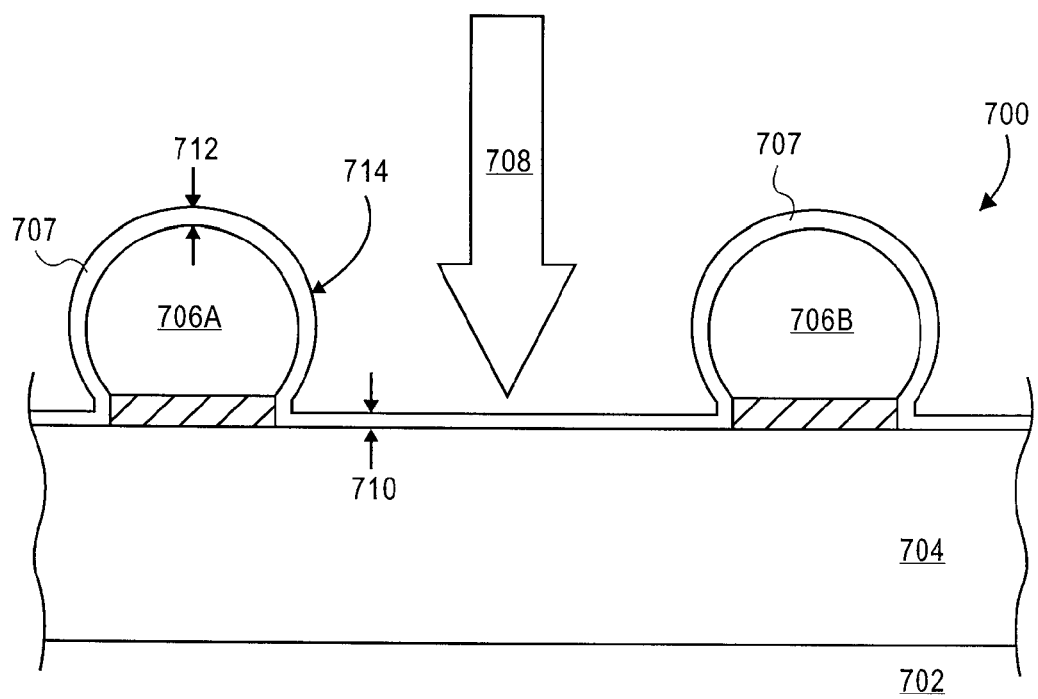
FIG. 7 illustrates a cross-sectional view showing laser scribing of a portion of a semiconductor wafer having a wafer coat layer formed in accordance with an alternative embodiment of the present invention.
Figure 8:
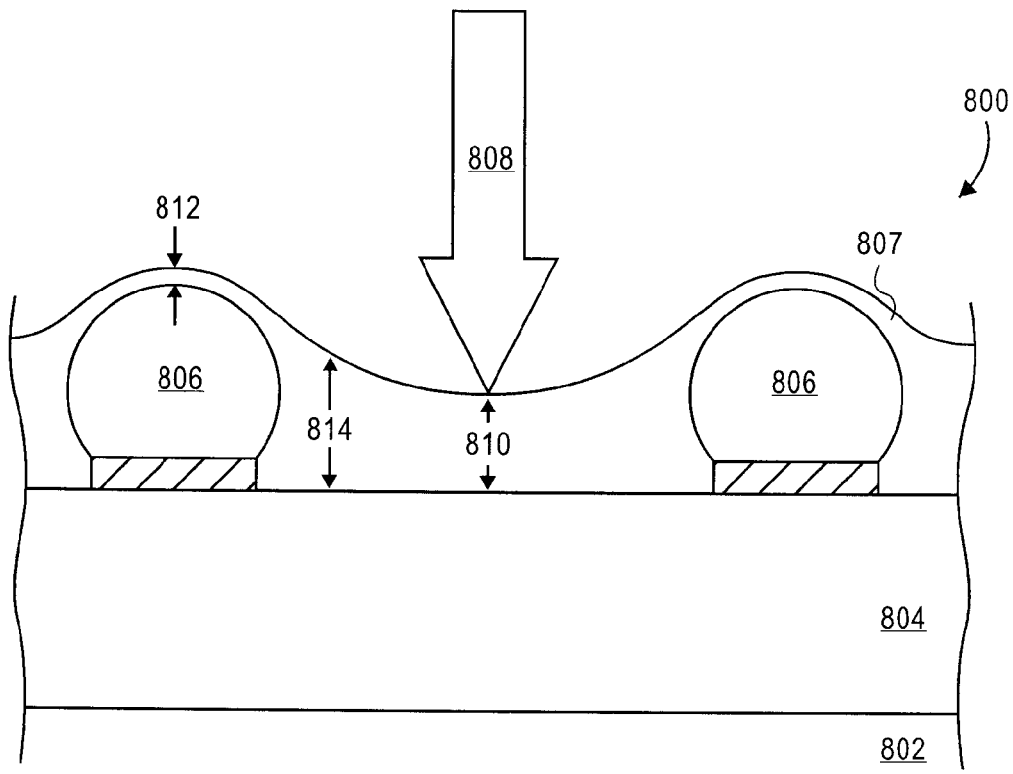
FIG. 8 illustrates a cross-sectional view showing a portion of a semiconductor wafer having a non-conformal wafer coat layer formed thereon.

In accordance with a final alternative embodiment, discussed with respect to FIGS. 7 and 8, a conformal wafer coat layer is disclosed. In this embodiment, problems associated with wafer coat layer non-uniformity are addressed by depositing a conformal wafer coat layer 707 over bumps 706 and device layers 704, as shown in FIG. 7. Like the conventional process, after laser scribe, the conformal wafer coat layer (and laser scribing debris) is removed using a process that is compatible with the wafer coat layer.

The conformal wafer coat layer disclosed herein overcomes wafer-coat layer thickness variability problems encountered with conventional wafer coat layers. These variability problems are primarily due to the liquid nature of the wafer coat deposition process. For example, wafer coat layers that use a BGA attach flux (e.g., a WF series Sparkle flux) as the wafer coat material are typically sprayed-on, spun-on, dipped-on or screen printed on.

All process where the flux is in liquid form when applied to the wafer surface. This means that the resulting wafer coat layer thickness and conformality can be affected by many factors, such as underlying surface geometry variations, wafer coat layer thickness, surface tension variations between the wafer coat layer and different types of underlying structures, drying time, operator handling, etc.

Typically, adequate bump protection is only achieved by forming a sufficient thickness of wafer coat material over the bumps. In many cases, this means that an excessive wafer coat layer thickness is formed in scribe line regions. As shown in FIG. 8, the wafer coat layer 807 must be deposited at least to a minimum thickness 812 that will cover the bumps 806 and adequately protect them from debris (not shown). However, this often times means, due to the wet nature of the deposition process as discussed previously, that the thickness 810 of the wafer coat layer in regions overlying the device layers 804 can be much thicker. For example, in one case where a spray on process was used to deposit a conventional BGA flux wafer coat layer, the thickness 812 of the wafer coat layer over the bumps measured 1-2 microns while the thickness 810 of the wafer coat layer in regions over the scribe line measured greater than forty microns. Since the laser has to ablate the device layer in regions where the wafer coat layer is for all intensive purposes it's thickest, the extra thickness has the potential to interfere with the laser's functioning and performance. For example, the added thickness means more wafer coat layer material is now available to contaminate the laser's lens, which can contribute to laser scribing system downtime. Also, to the extent that a thicker wafer coat layer takes longer to remove than a thinner one, the excess thickness contributes to increased cycle time during the laser scribing process. Moreover, in so far as the laser beam 808 encounters excessive and/or non-uniform wafer coat layer thicknesses near the laser scribe lines (for example if the laser were to scribe through the scribe line in regions where the wafer coat layer thickness was 814 as opposed to 810) additional/unanticipated optical refraction, diffraction, and scattering of the laser beam could result. This can produce shallow and/or even discontinuous laser scribing thereby contributing to the formation unablated scribe line material defects. It is worth noting here that defectivity levels can be much more pronounced in wafers where the surface topology includes sudden and significant depth changes such as in cases where the wafers already have deep trenches in the street regions.

In accordance with embodiments discussed with respect to FIG. 7, the foregoing problems can be reduced by depositing a conformal wafer coat layer over the bumps prior to the laser scribe operation. As shown in the cross-section 700 of FIG. 7, the conformal wafer coat layer deposition process produces a wafer coat layer 707 that has a thickness 712 over the bumps 706 that is relatively close to the thickness 710 over the scribe line region. In this way, problems encountered by the laser beam 708 with excessive wafer coat layer thicknesses are reduced and/or avoided. For the purpose of this specification, relatively close means that the thickness 712 of the wafer coat layer material on the bump at is within approximately twenty-five percent of the thickness of the wafer coat layer at a point 710 adjacent the bump. So for example, if the thickness 710 of the wafer coat layer laterally adjacent the sidewall 714 of bump 706A is 100 nanometers, then the thickness 712 of the wafer coat layer on the bump 706A, because it varies by less than 25%, would be in a range of approximately 75-125 nanometers.

In accordance with one implementation of this embodiment, the conformal wafer coat layer can be deposited in a physical vapor deposition (PVD) chamber by heating a PVD source at a temperature and pressure capable of forming the conformal layer over the wafer. Then, after wafer scribing is complete, an appropriate solvent or evaporation process can be used to remove the conformal layer.

In one specific implementation, wafer(s) are put inside a PVD chamber that contains a di-para-xylylene dimer source material. The chamber is pumped down to a pressure and the source is heated to a temperature capable of subliming the dimer so it can deposit onto the surface of the wafer over the bumps. In accordance with one embodiment, the pressure is in a range of approximately 0.75-1.25 Torr and the temperature is in a range of approximately 130-170 degrees Celsius.

After forming the conformal wafer coat layer, the wafer(s) are removed from the PVD chamber and then laser scribed. Following the laser scribing operation, the scribing debris and the di-para-xylylene layer can be cleaned off using a non-polar solvent, such as acetone. The di-para-xylylene is soluble in the non-polar solvent and can therefore be cleaned off easily.

The conformally deposited wafer coat layer disclosed herein is formed using a relative dry, solvent free process with no liquid phase. It therefore does not pool, bridge, or exhibit meniscus properties during formation, and it can provide a uniform, pin-hole free, and conformal surface coverage on top of the wafers. The thickness of the film can be optimized solely based on its ability to provide sufficient bump protection during the laser scribing process. In addition, because this wafer coat layer process has the potential to provide improved conformal coverage independent of surface topology, the process recipe can be standardized on wafers having different devices, die sizes, etc.

Removal of the di-para-xylylene thin film (and the laser generated debris) can alternatively be removed by placing the wafer(s) back to a vacuum chamber, pressurizing and heating the chamber to create conditions that promote vaporization of the di-para-xylylene thin film from the wafer surface. In one specific embodiment, similar to the deposition process, the chamber is heated to a temperature in a range of 130-170 degrees Celsius and the chamber pressure is in a range of approximately 0.75-1.25 Torr. Under these conditions, the coated di-para-xylylene layer can be vaporized from the wafer surface. This additionally loosens laser scribing debris deposited on the conformal wafer coat layer. The loosened laser scribe debris can then be washed off using a water rinse process.

The embodiments discussed with respect to FIG. 7 can provide a uniform and conformal coating on a wafer independent of its surface geometry and/or street profile. This facilitates laser scribing of wafers with highly complex surface structures and trenched streets. In addition, the coating process can be optimized for one product type and then easily be transferred to other types of wafers with minimal changes to the process. This simplifies the engineering design and related support processes required to integrate the conformal wafer coat layer process. Furthermore, the conformal wafer coat layer disclosed herein helps to further efforts to reduce die sizes because the need to position bumps away from scribe line streets by certain distances to compensate for wafer coat layer variation is reduced and/or eliminated. This facilitates die size reduction by allowing the die bumps to be placed closer to the edge of the die. This translates to an increase in the number of die per wafer and thereby reduces fabrication and assembly per unit costs.

In the foregoing embodiments, various wafer coat layer formulations and processes have been disclosed that can improve laser scribing manufacturability and yields. One of ordinary skill recognizes that these formulations and processes are not mutually exclusive from each other and that they can be combined to collectively take advantage of their individual benefits. For example the OSP additive and the UV absorber additive can be included together as part of a single wafer coat formulation. Similarly, an OSP and/or an UV absorber sources can alternatively be included in the PVD chamber along with the conformal wafer coat layer source to form a conformal wafer coat layer that additionally protects bumps against oxidation and/or absorbs UV energy from the laser.

The various implementations described above have been presented by way of example only and not limitation. Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of processing a semiconductor wafer comprising:
   forming a wafer coat layer over a wafer comprising a plurality of integrated circuit having a plurality of exposed conductive structures, wherein said plurality of integrated circuits are separated by a scribe line area and wherein said wafer coat layer includes an organic surface protectant; and
   removing said wafer coat layer such that said organic surface protectant and a UV absorber remain over the conductive structures.

2. The method of claim 1 further comprising after depositing said wafer coat layer, laser scribing said wafer coat layer and one or more layers formed in said scribe line area between said plurality of said integrated circuits.

3. The method of claim 2 further comprising after laser scribing, singulating said wafer to separate said integrated circuits.

4. The method of claim 3 wherein said singulating occurs after removing said wafer coat layer.

5. The method of claim 3 wherein said singulating occurs before removing said wafer coat layer.

6. The method of claim 1 wherein said wafer coat layer comprises a water soluble BGA attach flux.

7. The method of claim 1 wherein said organic surface protectant is selected from the group consisting of benzotriazol, benzimidazol, and imidazol.

8. The method of claim 1 wherein said wafer coat layer is removed using a solution comprising water.

9. The method of claim 1 wherein said wafer coat layer is conformal.

* * * * *